United States Patent [19]

Niwayama et al.

[11] Patent Number: 4,881,118
[45] Date of Patent: Nov. 14, 1989

[54] SEMICONDUCTOR DEVICE

[75] Inventors: Kazuhiko Niwayama; Tsutomu Nakagawa; Futoshi Tokunoh; Shigekazu Yoshida, all of Itami, Japan

[73] Assignee: Mitsubishi Denki Kabushiki Kaisha, Tokyo, Japan

[21] Appl. No.: 346,277

[22] Filed: Apr. 28, 1989

Related U.S. Application Data

[63] Continuation of Ser. No. 156,567, Feb. 17, 1988, abandoned.

[51] Int. Cl.$^4$ .................... H01L 23/10; H01L 23/04; H01L 21/603
[52] U.S. Cl. ........................................ 357/79; 357/68; 357/74
[58] Field of Search ........................ 357/79, 74, 67, 68

[56] References Cited

U.S. PATENT DOCUMENTS

| | | | |
|---|---|---|---|
| 4,104,676 | 8/1978 | Bednorz et al. | 357/79 |
| 4,151,543 | 4/1979 | Hayakawa et al. | 357/68 |
| 4,559,697 | 12/1985 | Sadamori . | |

FOREIGN PATENT DOCUMENTS

| | | | |
|---|---|---|---|
| 47-4818 | 2/1972 | Japan . | |
| 0101968 | 6/1985 | Japan | 357/68 |
| 977284 | 12/1964 | United Kingdom . | |

Primary Examiner—Rolf Hille
Assistant Examiner—S. V. Clark
Attorney, Agent, or Firm—Oblon, Spivak, McClelland, Maier & Neustadt

[57] ABSTRACT

One surface of a cathode sliding compensator is finished as an irregular surface while another surface thereof is finished as a sliding surface. The irregular surface is arranged to contact with a cathode electrode layer of a semiconductor element while the sliding surface is arranged to contact with a cathode conductor, and junction surfaces therebetween are electrically and mechanically connected by pressurization. Thus, the irregular surface bites into the cathode electrode layer to attain excellent electrical and mechanical connection between the cathode electrode layer and the cathode sliding compensator, while slidingness can be effectively retained between the cathode conductor and the cathode sliding compensator by the function of the sliding surface.

12 Claims, 3 Drawing Sheets

SEMICONDUCTOR DEVICE

This application is a continuation of application Ser. No. 156,567 filed on Feb. 17, 1988, now abandoned.

BACKGROUND OF THE INVENTION

1. Field of the Invention

The present invention relates to a pressure-connection type semiconductor device and more particularly it relates to an improvement in an electrical contact structure between a semiconductor element and a conductor.

2. Description of the Prior Art

In a general pressure-connection type semiconductor device, a semiconductor element and a conductor are electrically brought into contact with each other by mechanical pressure connection. If the semiconductor element and the conductor are welded by a brazing filler metal or the like, the semiconductor device is degraded by thermal fatigue of the brazing filler metal or the like, while no such problem is caused in case of mechanical pressure connection.

However, the following conditions are required for such a pressure-connection type semiconductor device. First, sufficient contact strength must be provided in an interface between the semiconductor element and the conductor. Second, the interface between the semiconductor element and the conductor must have high slidingness and low electrical and thermal resistance. Further, no excessive mechanical stress must be applied to the semiconductor element.

In order to cope with such requirements, there has been proposed a semiconductor device which is provided with a cathode sliding compensator between a semiconductor element and a conductor, as disclosed in Japanese patent Publication Gazette No. 4818/1972, for example.

FIG. 1 is an exploded sectional view showing a pressure-connection type semiconductor device employing such a cathode sliding compensator. FIG. 2 is a sectional view of a power thyristor, which is employed as a semiconductor element for the semiconductor device as shown in Fig. 1. Referring to FIG. 2, gallium is first diffused from both surfaces of an N-type silicon substrate 1 to form P-type diffusion regions 2 and 3 of prescribed depth from the surfaces of the N-type silicon substrate respectively, thereby to obtain a PNP structure. Then, phosphorus is diffused in the form of a ring into the P-type diffusion region 3, to form an N-type diffusion region 4. The P-type diffusion region 2 is joined with a molybdenum disc 5 through alloy junction by a brazing filler metal of aluminum. Further, aluminum is vacuum-evaporated on the N-type diffusion region 4 to form a cathode electrode layer 7, while aluminum is vacuum-evaporated on a part of the P-type diffusion region 3 to form a gate electrode layer 8. Thus, a thyristor element 9 is formed to serve as a power thyristor.

The structure as shown in FIG. 1 will be make clear by the following description. A cathode sliding compensator 10 is provided on the cathode electrode layer of the thyristor element 9 and an insertion plate 11 is provided on the cathode sliding compensator 10, while a cathode conductor 12 is further provided on the insertion plate 11. On the other hand, another insertion plate 13 is provided under the molybdenum disc 5 of the thyristor element 9 and an anode conductor 14 is provided under the insertion plate 13. The cathode conductor 12 and the anode conductor 14 are pressurized from both sides by a housing or the like, thereby to electrically and mechanically connect the respective members with each other.

The cathode sliding compensator 10 is prepared by a metal material such as molybdenum or tungsten, which is similar in thermal expansion coefficient to silicon forming the thyristor element 9. In order to attain excellent slidingness, the surface of the cathode sliding compensator 10 is polished so that roughness of the said surface is not more than 0.5 $\mu$m.

The reasons for providing the cathode sliding compensator 10 with surface roughness of not more than 0.5 $\mu$m will be make clear by the following description. Assuming that no insertion plate 11 is provided but the cathode conductor 12 is directly in contact with the cathode electrode layer 7 of the thyristor element large friction is caused in the contact surface between the cathode electrode layer 7 and the cathode conductor 12, due to difference in thermal expansion coefficient between the thyristor element 9 and the cathode conductor 12, following temperature change caused by heat generated by the semiconductor device itself in energization. Thus, the cathode electrode layer 7 of the thyristor element 9 is extremely damaged and stress is powerfully applied to the silicon substrate 1. In order to solve the problem, the cathode sliding compensator 10 is prepared by the metal such as molybdenum or tungsten, which is similar in thermal expansion coefficient to silicon forming the thyristor element 9 to be inserted between the thyristor element 9 and the cathode conductor 12. Consequently, sliding between the cathode sliding compensator 10 and the cathode electrode layer or sliding between the cathode sliding compensation 10 and the cathode conductor 12 is facilitated to reduce the friction of the thyristor element g against the cathode conductor 12. This is the reason that both sliding surfaces of the cathode sliding compensator 10 are polished as hereinabove described.

The insertion plates 11 and 13 are prepared by a conductive soft metal such as silver. Such insertion plates 11 and 13 are provided for the following reason: In the thyristor element 9, the p-type diffusion region 2 of silicon is in alloy junction with the molybdenum disc 5 through the brazing filler metal 6 of aluminum. As the result, the thyristor element 9 is curved in a constant direction following heat generated in energization thereof, due to difference in thermal expansion coefficient between silicon and molybdenum. Thus, assuming that the molybdenum disc and the cathode electrode layer are directly pressure-connected with the anode conductor 14 and the cathode conductor 12 respectively in such a curved state of the thyristor element 9, no sufficient contact can be obtained between such elements. Thus, the conductive soft metal members are interposed between such elements, to ensure sufficient contact therebetween.

Since aluminum is easily oxidized, an extremely thin aluminum oxide film is formed on the surface of the cathode electrode layer in the process of manufacturing the semiconductor device. Consequently, electrical contact between the cathode electrode layer and the cathode sliding compensator 10 is made insufficient by presence of such an aluminum oxide film, to cause fall of potential. Thus, power loss in the thyristor element 9 is increased to exert a bad influence on thyristor characteristics.

SUMMARY OF THE INVENTION

A semiconductor device according to the present invention comprises a semiconductor element having a cathode metal layer formed on one surface thereof and an anode metal layer formed on another surface thereof, an anode conductor provided to contact with the surface of the anode metal layer; a cathode sliding compensator having one surface being finished as an irregular surface and another surface being finished as a sliding surface and being so arranged that the irregular surface contacts with the surface of the cathode metal layer; a cathode conductor arranged to contact with the sliding surface of the cathode sliding compensator; and means for holding the cathode conductor and the anode conductor to pressurize respective junction surfaces between the cathode conductor, the cathode sliding compensator, the semiconductor element and the anode conductor.

Accordingly, an object of the present invention is to provide a semiconductor device which can excellently improve electrical contact between a semiconductor element and a cathode sliding compensator as well as effectively retain slidingness of a cathode conductor and the cathode sliding compensator.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
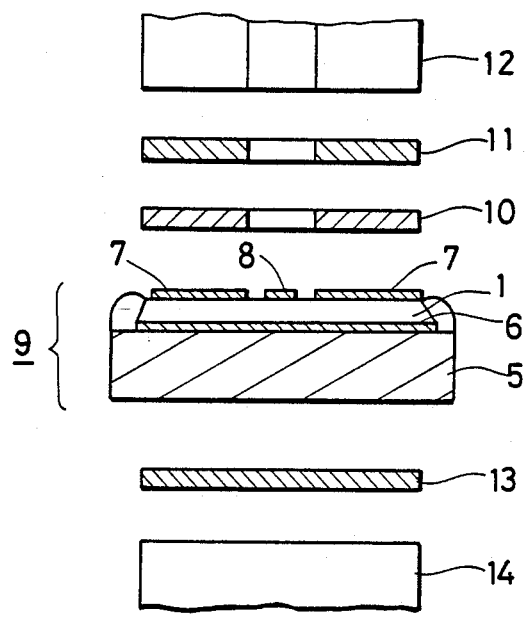
FIG. 1 is an exploded sectional view showing a conventional semiconductor device.
Figure 2:
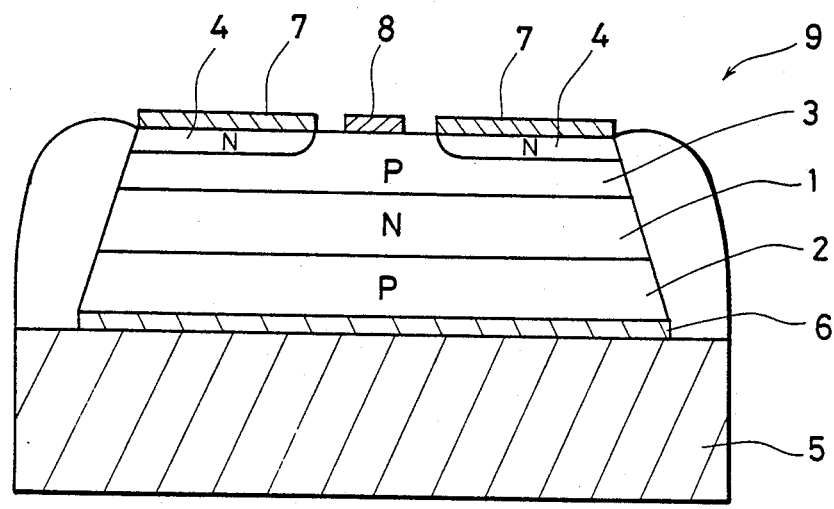
FIG. 2 is a sectional view showing a power thyristor.
Figure 3:
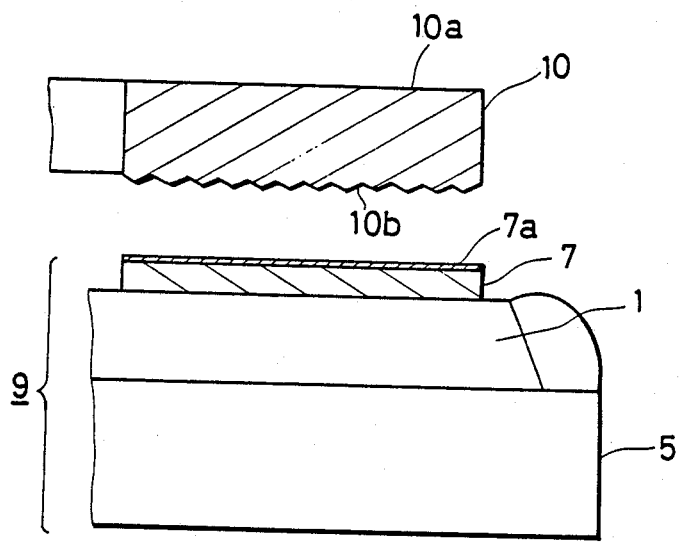
FIG. 3 is a partially fragmented sectional view showing a semiconductor device according to the present invention being in advance of fabrication.
Figure 4:
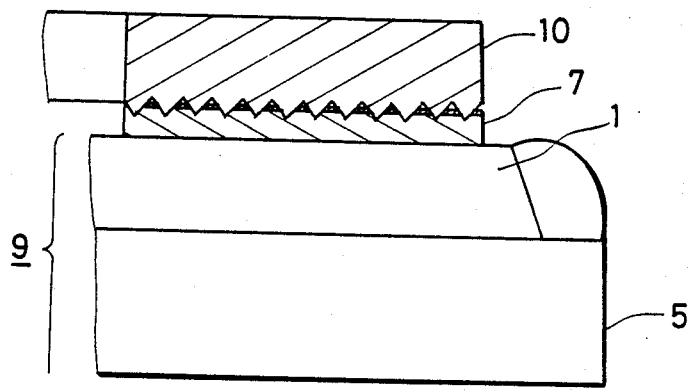
FIG. 4 is a partially fragmented sectional view showing the semiconductor device according to the present invention being in a fabricated state.

FIG. 3 is a partially fragmented sectional view showing a semiconductor device according to the present invention being in advance of fabrication, and FIG. 4 is a partially fragmented sectional view showing the semiconductor device being in a fabricated state. Referring to FIGS. 3 and 4, numerals identical to those of the conventional structure as shown in FIG. 1 indicate the same or corresponding components.

As shown in FIG. 8, in a cathode sliding compensator 10 of molydenum, tungsten or the like, a surface thereof facing a cathode conductor 12 is polished similarly to the conventional case by an abrasive of small grain size, for example, to be finished as a sliding surface 10a having surface roughness of not more than 0.5 μm. Another surface of the cathode sliding compensator 10 facing a thyristor element 9 is treated by nitric acid or a mixed solution thereof or polished by an abrasive of large grain size, to be finished as an irregular surface 10b having surface roughness of about 1 to 5 μm.

On a surface part of a cathode electrode layer 7 of the thyristor element 9, an aluminum oxide film 7a is naturally formed after vacuum evaporation thereof.

Thus, when the semiconductor device of this embodiment is so assembled that the cathode conductor 12 and an anode conductor 14 are pressurized from both sides, the irregular surface 10b of the cathode sliding compensator 10 is bitingly brought into contact with the aluminum oxide film 7a formed on the surface of the cathode electrode layer 7 of the thyristor element 9 as shown in FIG. 4, to break the aluminum oxide layer 7a, whereby the thyristor element 9 and the cathode sliding compensator 10 are brought into direct contact with each other to attain excellent electrical contact.

Even if slidingness between the thyristor element 9 and the cathode sliding compensator 10 is degraded by the irregular surface 10b biting into the aluminum oxide film 7a, friction therebetween following temperature change caused by energization of the device causes no particular problem since the thyristor element 9 and the cathode sliding compensator 10 are substantially equal in thermal expansion coefficient to each other.

Since the sliding surface 10a of the cathode sliding compensator 10 retains effective slidingness similarly to the conventional case, no influence is exerted on the thyristor element 9 by expansion/contraction caused by temperature change of the cathode conductor 12.

Figure 5:
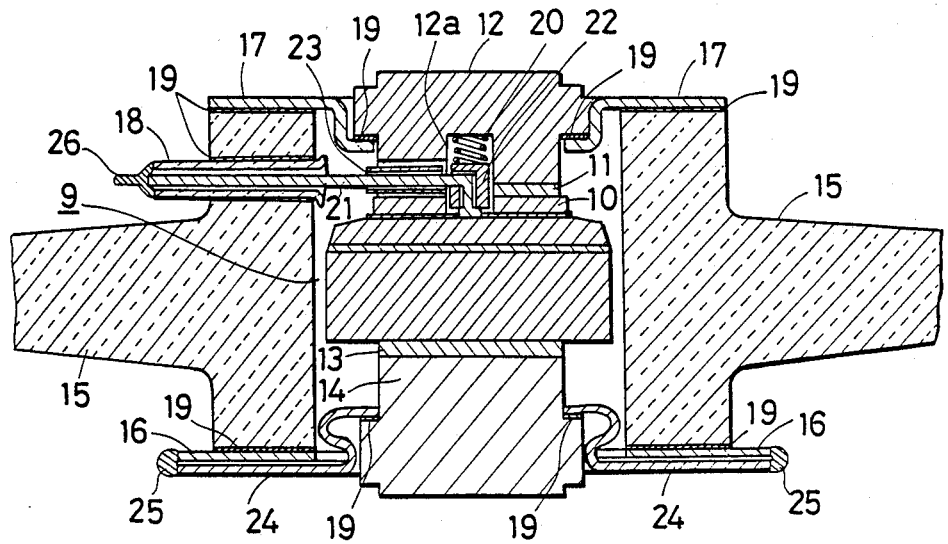
FIG. 5 is a sectional view showing the entire semiconductor device according to the present invention being in a fabricated state.

FIG. 5 is a sectional view showing the entire semiconductor device according to the present invention, which is in a fabricated state. Referring to FIG. 5, the semiconductor device is in the following state before the thyristor element is assembled into a sealing case: An annular ceramic member 15 having a rib, a cathode welding flange 16 of kovar, a cathode flange 17, a cathode conductor 12 having a cavity 12a in its central portion and a gate pipe 18 of kovar are airtightly brazed by silver solder members 19 respectively. A gate pressing spring 20 is provided in the cavity 12a in the central portion of the cathode conductor 12, which cavity 12a receives a gate support block 22 of ceramic. A gate lead wire 21 passes through the center of a cylindrical portion of the gate support block 22 to transversely project toward the exterior thereof. The gate lead wire 21 projecting from the side surface of the gate support block 22 passes through a gate insulation tube 23, which is a groove-shaped passage of Teflon provided in the cathode conductor 12, to be inserted in the gate pipe 18. An anode flange 24 of kovar having a portion being S-shaped in section is mounted on the cathode conductor 14 by the silver solder member 19. Thus, preliminary assembling is completed.

Then, in the state of that a block formed by the annuler ceramic member 15, the cathode welding flange 16, the cathode flange 17, the cathode conductor 12 and a gate pipe 18 is inverted against the posture shown in FIG. 5, the ring-shaped insertion plate II and the cathode sliding compensator 10 are fitted in this order in a projecting portion of the gate support block 22. Thereafter the thyristor element 9 and the insertion plate 13 are fitted in this order in the ceramic member 15 as shown in FIG. 5, to be covered by the anode conductor 14. Then arc welding is performed on outer peripheries of the cathode flange 16 and the anode flange 24 while externally applying pressure to the cathode conductor 12 and the anode conductor 14. Numeral 25 indicates such welding portion. Finally gas is exhausted from the interior of such a semiconductor device through the gate pipe 18 to be replaced by new filler gas, which in turn is sealed by projection welding. Numeral 26 indicates a gate pipe welding portion.

The inventive semiconductor device is thus assembled, so that the thyristor element the cathode sliding compensator 10, the insertion plates 11 and 13, the cathode conductor 12 and the anode conductor 14 are brought into pressure connection with each other.

The present invention is not restricted to the embodiment as hereinabove described in detail. For example, the semiconductor element may be formed by a diode or another element of a material other than silicon. The sliding compensator may be prepared by a metal other than molybdenum, such as tungsten, kovar or tantulum, to attain a similar effect. Further, two or more such sliding oompensators may be used in lamination in order to effectively solve the problem of the prior art. Such laminated sliding compensators may be prepared by different metal materials, as a matter of course.

The insertion plates are not necessarily required but the cathode sliding compensator and the cathode conductor may be brought into direct contact with each other, or the semiconductor element may be directly in contact with the anode conductor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor having a cathode electrode layer formed of aluminum on one surface thereof and an anode electrode layer formed on another surface thereof;
   an anode conductor arranged to contact with the surface of said anode electrode layer;
   a cathode sliding compensator made of a material having a thermal coefficient substantially similar to that of a semiconductor and having one surface being finished as an irregular surface and another surface being finished as a sliding surface, said irregular surface being arranged to contact with the surface of said cathode electrode layer;
   a cathode conductor made from a material having a thermal coefficient different than that of a semiconductor and arranged to contact with said sliding surface of said cathode sliding compensator; and
   means for holding said cathode conductor and said anode conductor so as to pressurize respective junction surfaces between said cathode conductor, said cathode sliding compensator, said semiconductor element and said anode conductor such that the irregular surface of said compensator penetrates any oxide formed on said aluminum cathode electrode layer.

2. A semiconductor device in accordance with claim 1, wherein
   surface roughness of said irregular surface of said cathode sliding compensator is 1 to 5 $\mu$m.

3. A semiconductor device in accordacne with claim 1, wherein
   surface roughness of said sliding surface of said cathode sliding compensator is not more than 0.5 $\mu$m.

4. A semiconductor device in accordance with claim 1, wherein
   said cathode sliding compensator is prepared by a material selected from molybdenum, tungsten, kovar and tantalum.

5. A semiconductor device in accordance with claim 1, wherein
   a plurality of said cathode sliding compensators are employed in lamination.

6. A semiconductor device in accordance with claim 5, wherein
   said plurality of cathode sliding compensators are formed by metal materials which are different in type from each other.

7. A semiconductor device in accordance with claim 1, wherein
   said semiconductor element is a thyristor.

8. A semiconductor device in accordance with claim 1, wherein
   said semiconductor element is a diode.

9. A semiconductor device in accordance with claim 1, wherein
   an insertion plate is provided between said cathode sliding compensator and said cathode conductor.

10. A semiconductor device in accordance with claim 9, wherein
    said insertion plate is made of silver.

11. A semiconductor device in accordance with claim 1, wherein
    an insertion plate is provided between said semiconductor element and said anode conductor.

12. A semiconductor device in accordance with claim 11, wherein
    said inseriton plate is made of silver.

* * * * *